US008778706B2

(12) United States Patent
Chu et al.

(10) Patent No.: US 8,778,706 B2
(45) Date of Patent: Jul. 15, 2014

(54) METHOD TO PROVIDE MICROSTRUCTURE FOR ENCAPSULATED HIGH-BRIGHTNESS LED CHIPS

(75) Inventors: Philip Yi Zhi Chu, Monrovia, CA (US); Stanley Tafeng Kao, Torrance, CA (US); Lev Katsenelenson, Los Angeles, CA (US)

(73) Assignee: Luminit LLC, Torrance, CA (US)

( * ) Notice: Subject to any disclaimer, the term of this patent is extended or adjusted under 35 U.S.C. 154(b) by 578 days.

(21) Appl. No.: 12/940,533

(22) Filed: Nov. 5, 2010

(65) Prior Publication Data

US 2011/0108874 A1 May 12, 2011

Related U.S. Application Data

(60) Provisional application No. 61/258,418, filed on Nov. 5, 2009.

(51) Int. Cl.
*H01L 33/56* (2010.01)
(52) U.S. Cl.
USPC .. 438/27; 257/96; 257/E33.073; 257/E33.056
(58) Field of Classification Search
USPC ................................ 438/27; 257/E33.073
See application file for complete search history.

(56) References Cited

U.S. PATENT DOCUMENTS 6,110,401 A * 8/2000 Lee et al. ...................... 264/1.34
7,919,339 B2 * 4/2011 Hsu ............................... 438/28

OTHER PUBLICATIONS

"Illumitex Seeks Cash to Brighten and Shrink LEDs" Reuters.com Article, pp. 1-2, www.Reuters.com/article/earth2Tech/idUS7541598320090615.
Vandersteegen et al., "Increasing Light Extraction of a Substrate Emitting OLED Using a 2D Surface Grating," IEEE Xplore (2006) pp. 502-503.
"TOWA's Semiconductor Molding Technology: Meeting all your Production Needs," http://www.towajapan.co.jp/english/solution/molding/index.htm, webpage, pp. 1-2.
"FFT1030W", http://www.towajapan.co.jp/english/products/fft1030w/index.htm, webpage, pp. 1-2.

* cited by examiner

*Primary Examiner* — Marc Armand
(74) *Attorney, Agent, or Firm* — Husch Blackwell LLP

(57) ABSTRACT

Encapsulated LEDs can be made by taking a mold tool defining a cavity that defines a lens shape and providing a patterned release film defining the inverse of a microstructure in a surface of the film. The patterned release film is conformed to the cavity of the mold tool. An LED chip is placed in a spaced relationship from the patterned release film in the cavity. A resin is then introduced into the space between the LED chip and the patterned release film in the cavity. The resin is cured in the space between the LED chip and the patterned release film in the cavity while contact is maintained between the patterned release film and the curing resin. The encapsulated LED is then freed from the mold tool and the patterned release film.

9 Claims, 2 Drawing Sheets

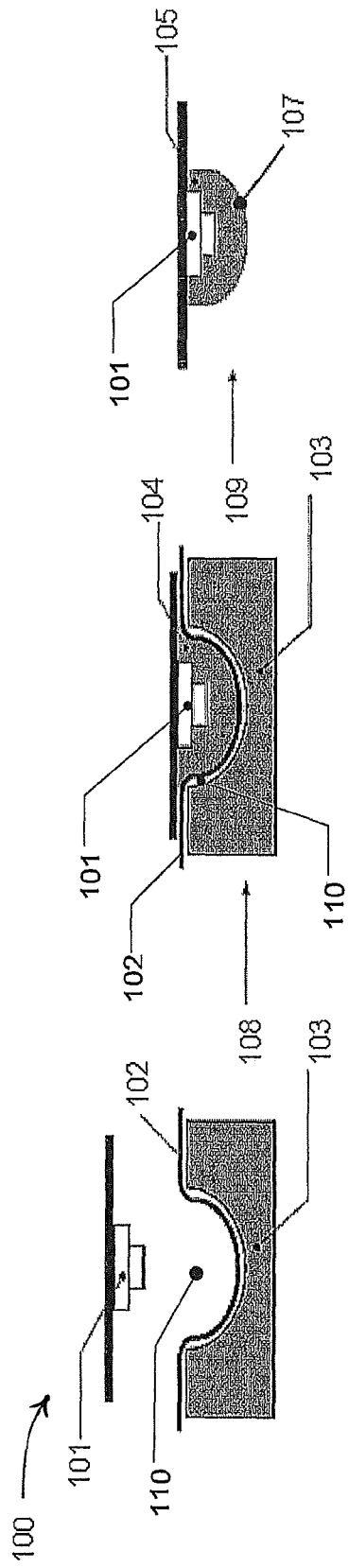
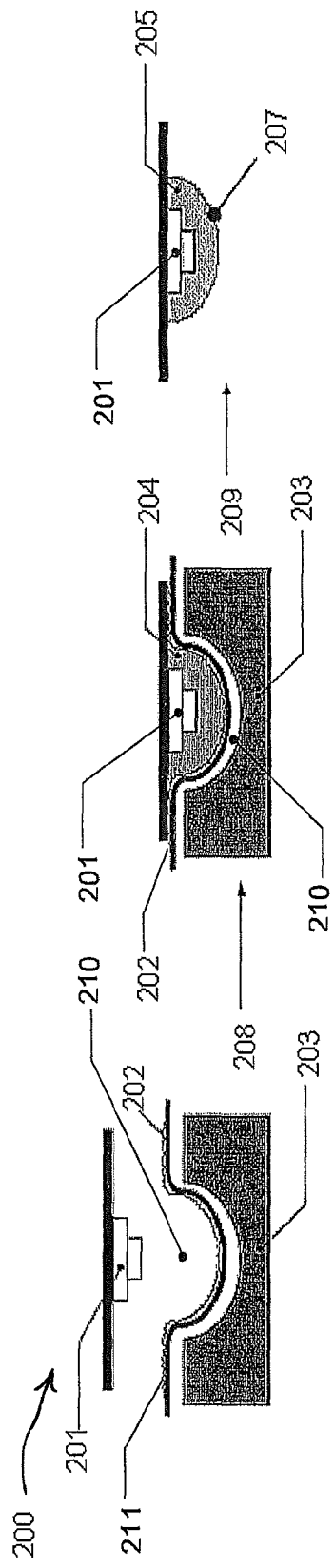
Figure 1 (PRIOR ART)
Figure 2

METHOD TO PROVIDE MICROSTRUCTURE FOR ENCAPSULATED HIGH-BRIGHTNESS LED CHIPS

CROSS-REFERENCE TO RELATED APPLICATION

This application claims the benefit of the filing date of U.S. Provisional Application Ser. No. 61/258,418 filed Nov. 5, 2009 and entitled "Optical Microstructure Array for Light Emitting Diode Packaging".

FIELD OF THE INVENTION

The present disclosure relates the field of optics. More specifically, the present disclosure concerns solid state lighting.

BACKGROUND OF THE INVENTION

The U.S.A. spends over $70 billion on lighting annually. LEDs can significantly reduce both the economic and environmental costs of lighting energy thereby reducing the need to import energy from foreign sources and energy-related emissions, including greenhouse gases, while improving energy efficiency in all economic sectors. Continued strong growth is expected in the LED lighting market, especially with the commercial availability of high-brightness LEDs (HB-LEDs) for LCD TVs, signals/signs, automotive, street/parking lighting, and general commercial/industrial illumination.

Considerable research and development efforts have focused on improving HB-LEDs efficiency at the LED chip level. But overall luminosity of HB-LEDs is also influenced by the process of packaging (molding/encapsulating) of LEDs. Less effort has been made to increase overall luminous efficiency of HB-LEDs, which affects LED performance as terminal products in practical applications.

Currently, silicone resin is used as a chip encapsulant for HB-LEDs. Prior to molding the LED package, the mold is lined with a flexible, unpatterned, sacrificial release film (such as made from, but not limited to, fluoropolymer ETFE), to protect both the mold and the LED package from damage when the two are separated at the end of the process. Next, a silicone resin liquid is injected into the mold to form the final product (an encapsulated LED). Under a partial vacuum, an LED chip is then pressed into the silicone resin liquid spreading the liquid throughout the molding cavity along with the release film. Once the silicone solidifies under high temperature, the final molded LED package is released from the cavity. But the silicone traps a significant amount of the light generated by the LED chip because of its high refractive index and total internal reflection (TIR). The trapped light reduces the LED package's optical efficiency as well as its overall life because of the excess heat generated by the undesirably trapped light.

BRIEF SUMMARY OF THE INVENTION

Encapsulated LEDs can be made by taking a mold tool defining a cavity that defines a lens shape and providing a patterned release film defining the inverse of a microstructure in a surface of the film. The patterned release film is conformed to the cavity of the mold tool. An LED chip is placed in a spaced relationship from the patterned release film in the cavity. A resin is then introduced into the space between the LED chip and the patterned release film in the cavity. The resin is cured in the space between the LED chip and the patterned release film in the cavity while contact is maintained between the patterned release film and the curing resin. The encapsulated LED is then freed from the mold tool and the patterned release film.

Operably, the patterned release film forms an optical diffuser on the surface of the cured resin, and may even form a light shaping diffuser. The light shaping diffuser microstructure can be random, disordered, and non-planar structures that are non-discontinuous and have smoothly varying changes so as to provide scatter with non-discontinuous transmission of light through the microstructure. The structures can be that of recorded laser speckle such as that shown in FIG. 3.

The LED chip can be either an RGB diode package or a phosphor coated blue LED package. The lens may have a generally hemispherical shape, and be resin may be an optical quality silicone resin. The patterned release can be a fluoropolymer film having the microstructure integrally formed in the film where the pattern embodied in the release film can be microstructures having a feature size of up to about 100 micrometers.

Another aspect of the invention is a light emitting diode package made of a light emitting diode, a cured resin encapsulating the light emitting diode, where microstructures constituting a light shaping diffuser integrally formed in a surface of the cured resin.

BRIEF DESCRIPTION OF THE SEVERAL VIEWS OF THE DRAWING(S)

The advantages of the presently disclosed encapsulated light emitting diode, as well as additional advantages, will be more fully understood as a result of a detailed description of an operable embodiment and the following drawings.

FIG. 1 is a description of an existing process for encapsulation/packaging of LEDs;

FIG. 2 is a description of an operable embodiment of the present invention and the method by which the present invention is used.

DETAILED DESCRIPTION OF THE INVENTION

Figure 3:
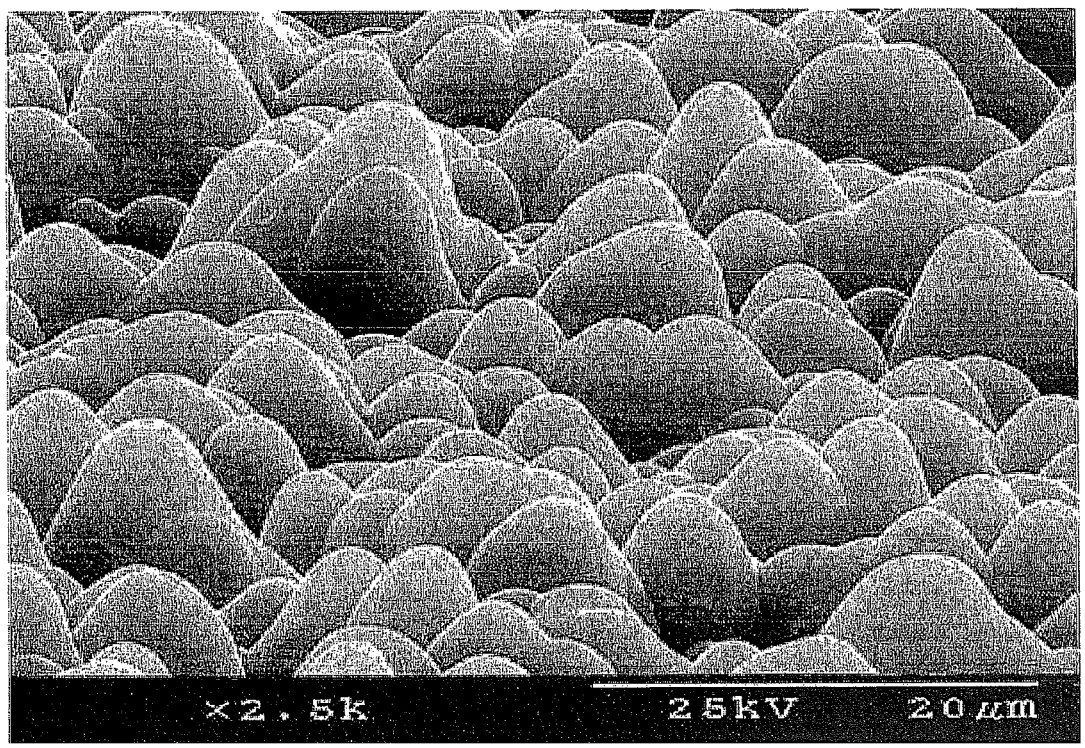
FIG. 3 is a photomicrograph of an example of an optical microstructure which comprises the surface relief pattern of the apparatus of the present invention in one of its operable embodiments.

The disclosed embodiments of these relevant skills in the art of this disclosure can be modified and added to for various perceived applications. Accordingly, it will be understood that the scope hereof is not to be limited to these embodiments.

Referring to FIG. 1, a prior art method of forming encapsulated LEDs is illustrated. Prior Art Process 100 begins by providing an LED chip 101 spaced from a smooth release film 102 that is on a cavity formed 110 in mold tool 103. The LED chip 101 can be of any type or color, with white light typically coming either from either the packaging of red, green and blue LEDs or the use of a phosphor on a blue LED. The technology described is suitable for high-brightness LED lighting applications, among others. The release film 102 is flexible so that it can conform to the shape of the mold tool 103 and the cavity 110 therein. The cavity 110 in mold tool 103 is configured to form a lens for the light generated by the packaged LED chip. The lens shape can be a dome as illustrated or other form as a person of ordinary skill in the art desires to achieve a desired result. In step 108 a resin 104 substantially fills the volume between the LED chip 101 and the smooth release film 102 on the cavity 110. The resin 104 is then cured into encapsulant 105 while the release film 102 maintains contact with both the mold tool 103 and the resin 104, and the resin 104 maintains contact with the LED chip 101. The release film 102 and mold tool 103 are then removed from contact with the encapsulant 105. The result is a packaged LED chip 101 encased in encapsulant 105 where the encapsulant has a smooth surface 107.

Exemplary molding equipment for carrying out the process of FIG. 1 to make the product of FIG. 1 can be obtained from TOWA Corporation having a business address at 5 Kamichoshi-cho, Kamitoba, Minami-ku, Kyoto 601-8105, Japan. Present models include the FFT1030W and PMC1040-S. TOWA Corporation can be contacted about smooth fluoropolymer release films as well. High-brightness LED chips can be obtained from at least CREE, Inc. of Durham, N.C. Silicone resins are operable in the described processes and can be obtained from multiple suppliers including Dow Corning Corporation of Midland, Mich. Resins may be selected according to desired trade-offs of factors such as price, protection, clarity, stability, stress relief, matching the index of refraction of the light source, molding process conditions and thermal management. Other clear resins are also operable and have similar considerations in selection, but are generally viewed as inferior to silicone in the trade.

Referring to FIG. 2, an operable process 200 of the present disclosure is illustrated. Process 200 begins by providing an LED chip 201 spaced from a patterned release film 202 that is on a cavity 210 formed in mold tool 203. The release film 102 is flexible so that it can conform to the shape of the mold tool 103 and the cavity 110 therein. The patterned release film 202 is embossed with a microstructure 211, thereby constituting itself a molding tool for forming microstructure. Operably, the microstructure is integrally formed in the patterned release film. The microstructure can have a feature size smaller than one micrometer, and as large as the thickness of the release film 202. The LED chip 201 can be of any type or color, with white light typically coming either from either the packaging of red, green and blue LEDs or the use of a phosphor on a blue LED. The technology described is suitable for high-brightness LED lighting applications, among others. The cavity 210 in mold tool 203 is configured to form a lens for the light generated by the packaged LED chip. The lens shape can be a dome as illustrated or other form as a person of ordinary skill in the art desires to achieve a desired result. In step 208 a resin 204 substantially fills the volume between the LED chip 201 and the smooth release film 202 on the cavity 210. The resin 204 is then cured into encapsulant 205 while the release film 202 maintains contact with both the mold tool 203 and the resin 204, and the resin 204 maintains contact with the LED chip 201. The release film 202 and mold tool 203 are then removed from contact with the encapsulant 205. The result is an LED chip 201 encased in encapsulant 205 where the encapsulant has a microstructured surface 207. The materials for practicing process 200 are the same as for process 100 with the exception of the patterned release film. One patterned release film 202 of process 200 can operably, but not exclusively, be made via manufacturing processes as described below. Other patterns can be created according to other processes for creating masters for the pattern.

Regular and irregular patterns of microstructure 211 can be integrally embossed by using the release film 102 as a molding tool for the microstructure 211. Many examples of microlens arrays are known in the prior art. Examples of regular patterns would be prisms, pyramids, hemispheres ("dots"), cubes and the like, so long as the shapes will demold from the patterned release film 202. An example of an irregularly shaped microstructure pattern is illustrated in the microstructure of FIG. 3. It should be noted that the inverse generally has the same optical properties as the type shown in FIG. 3, but is a mirror-image of the structure in FIG. 3, not the structure of FIG. 3 itself. Regarding the pattern of the microstructure 211, one type of microstructure that can be embossed is an inverse of the type shown in FIG. 3. FIG. 3 is a micrograph of a microlens array structure that has been generated by a laser-speckle pattern in accordance with the descriptions that follow. The use of the microlens array structure 301 on the surface 207 of a packaged LED's encapsulant 205 can diminish the optical losses found in existing LED encapsulation schemes 100.

One way to make a patterned release film uses direct thermal replication. In this method, a nickel shim with a patterned surface can be used as a mold or tool. During thermal replication, under elevated temperatures (greater than the glass transition temperature of the release film) and uniform pressure, the pattern on the nickel surface can be transferred to the surface of a film of appropriate material (even a smooth release film). After the film is cooled and the film is removed from the nickel shim, the resultant patterned release film is suitable for use in forming encapsulants embossed with the pattern from the nickel shim.

An encapsulated LED comprises an LED chip 201 encapsulated in an encapsulant 205 having a microlens array structure at its surface 207. The encapsulant can be made from a silicone or other suitable optical resin 204. The patterned structure 301 once embossed or imprinted onto the previously smooth surface 207 of the encapsulant 205 which was created by the molding process 200. If a microstructure pattern such as the one shown in FIG. 3 is used to provide the surface of the encapsulated LED chip(s) there will be a significant increase in the amount of the light extraction from the molded LED package by around the total internal reflectance of the comparable structure, typically 2.5%, by reducing or eliminating the reflections found at the boundary of the LED's encapsulant and the ambient environment. This improvement is relative to the same structure having a smoothly surfaced 107 encapsulant 105. Further, such a microstructure can provide a reduction in color temperature in practice. The ability to influence the color temperature of an LED can be advantageous to those seeking warmer light from a high-brightness LED. Also, such a microstructure serves as a light shaping diffuser, permitting the light to be directed narrowly or broadly from the encapsulated LED, depending on the feature size. Wider features provide narrower distribution of light from the encapsulated LED.

As in U.S. Pat. No. 5,365,354 a master pattern can be made by providing a recording medium such as dichromated gelatin (DCG) or another volume recording material on a stable substrate such as glass. A mask diffuser aperture can then be placed between the recording medium and a source of coherent light. Then random, disordered, and non-planar speckles are non-holographically recorded on the recording medium on said recording medium by shining the coherent light that is scattered by the mask diffuser, on the surface of the recording medium in a way that the recording medium does not retain phase information. The field of random, disordered and non-planar speckles constitutes a pattern of the type shown in FIG. 3 recorded in the recording medium. The recording medium is then processed according to the procedures attendant to such recording medium. During the recording the light is controlled so that the speckles define non-discontinuous and smoothly varying changes in the recording medium so as to provide scatter, with non-discontinuous reflection, of light traveling from the first surface to the second surface. The statistical average size of the recorded speckles is inversely proportional to the angular size of the aperture viewed from the center of the diffuser.

As in U.S. Pat. No. 6,158,245, submasters can be made from a master. A frame is fastened to the edges of the master. The master should have edges rising slightly above the top surface of the master. Silicone rubber can then poured into the frame over the photoresist layer and allowed to cure. The silicone rubber constitutes an inverse submaster that is then separated from the photoresist/glass master. Use of silicon rubber permits separation of the submaster without damaging the master. Subsequent films matching the master may then be made from the inverse submaster by using epoxy supported by polypropylene sheet or other desirable film medium.

U.S. Pat. No. 6,110,401 discloses a simple, fast, and reliable method and apparatus for replicating a light shaping surface structure on a laminated surface of a relatively rigid substrate. In the case of a release film, the substrate can be polyester, nylon or cellulose acetate film. After the substrate is mounted on a table and a layer of epoxy is deposited between the substrate and an inverse submaster to produce a layered structure, the layered structure is automatically compressed in a nip formed between the table and an outer surface of a rotating impression roller, thereby replicating the surface structure in the epoxy layer. The submaster can be a polycarbonate sheet with the inverse of the patterned surface incorporated in it. The epoxy is then cured, and the submaster is separated from the substrate to leave a laminated structure having the microlens array structure at its surface. Operably, the submaster can be wrapped around the impression roller, and the impression roller is rotated while the table is reciprocated linearly to compress the layered structure in the nip. In order to prevent slippage between the submaster and the substrate, the rotational speed of the impression roller is matched to the translational speed of the table during the compressing operation—preferably by using the submaster as a drive belt to drive the roller to rotate upon table movement. The replicator preferably also automatically cures the epoxy after the compressing operation and then automatically separates the submaster from the substrate.

Furthermore, radiometric ray tracing (as detailed in U.S. Pat. No. 5,995,742, incorporated by reference in its entirety) modeling and simulation techniques may be used for modeling a solid state lighting device (e.g., LED) source, the randomized optical microstructures of the present invention, and the resulting increase in optical output of the associated solid state lighting device or system(s) incorporating it after the application of the present invention's randomized optical microstructures to said solid state lighting device(s). The underlying formula for calculating the optical power in said modeling and simulation effort is:

$$P=\iiiint B(x,y,k_x,k_y)dxdydk_xdk_y, \quad \text{(Eq. 1)}$$

where P is the output power of said solid state lighting system; $B(x,y;k_x,k_y)$ is equal to phase space density; x and y are the spatial coordinates that define the spatial point of intersection of a particular ray with a plane of said solid state light source, and $k_x$ and $k_y$ are directional coordinates that define an angle of intersection of a particular ray with a plane of said light source.

Although the above textual and graphical description of the present invention and its method of use may allow one skilled in the art to make and use what is currently believed to be substantially the best mode of the present invention, those skilled in the art will also understand that there will exist variations to and combinations of the elements contained in the specific methods, embodiments and/or examples described herein. Therefore, the present invention, herein disclosed, shall not be limited by the specific embodiments, examples or methods described in the text or figures above and that all such variations and combinations are intended by the inventor(s) to be within the scope and spirit of the present invention.

We claim:

1. A method of manufacturing an encapsulated LED comprising:
   providing an LED chip;
   providing a mold tool defining a cavity that defines a lens shape;
   providing a patterned release film defining the inverse of a microstructure in a surface thereof;
   conforming the patterned release film to the cavity of the mold tool;
   spacing the LED chip from the patterned release film in the cavity;
   introducing resin into the space between the LED chip and the patterned release film in the cavity;
   curing the resin in the space between the LED chip and the patterned release film in the cavity while maintaining contact between the patterned release film and the resin;
   freeing the encapsulated LED from the mold tool and the patterned release film.

2. The method of claim 1 where the patterned release film forms a diffuser.

3. The method of claim 1, wherein:
   the LED chip is either an RGB diode package or a phosphor coated blue LED package;
   the mold tool defines a cavity that is generally hemispherical;
   the patterned release film is a fluoropolymer film having the microstructure integrally formed in the film; and
   the resin is an optical quality silicone resin.

4. The method of claim 2 where the patterned release film forms a light shaping diffuser.

5. The method of claim 3, where the pattern embodied in the release film comprises microstructures, the microstructures having a feature size of up to about 100 micrometers.

6. The method of claim 5, where the pattern embodies in the release film is the inverse of the microstructure of the embossing tool (such as nickel shim).

7. The method of claim 6, where the light shaping diffuser microstructure is random, disordered, and non-planar speckles that are non-discontinuous and have smoothly varying changes so as to provide scatter with non-discontinuous transmission of light through the microstructure.

8. The method of claim 7, where the light shaping diffuser structure has the structure of recorded laser speckle.

9. The method of claim 8, where the light shaping diffuser structure is of the type shown in FIG. 3.

* * * * *